United States Patent [19]
Torii

[11] Patent Number: 6,105,661
[45] Date of Patent: Aug. 22, 2000

[54] COOLING APPARATUS

[75] Inventor: Yoshitsugu Torii, Tokyo, Japan

[73] Assignee: NEC Corporation, Japan

[21] Appl. No.: 09/184,222

[22] Filed: Nov. 2, 1998

[30] Foreign Application Priority Data

Oct. 31, 1997 [JP] Japan .................................. 9-299883

[51] Int. Cl.[7] .................................................. F28F 7/00
[52] U.S. Cl. ..................... 165/80.4; 165/908; 165/135; 165/80.3
[58] Field of Search ................. 165/80.3, 80.4, 165/135, 908

[56] References Cited

U.S. PATENT DOCUMENTS

| | | | |
|---|---|---|---|
| 3,843,910 | 10/1974 | Ringuet ..................... | 165/908 |
| 4,226,279 | 10/1980 | Eisinger et al. ............. | 165/135 |
| 4,266,602 | 5/1981 | White et al. ............... | 165/135 |
| 4,494,171 | 1/1985 | Bland et al. ............... | 165/908 |
| 4,674,004 | 6/1987 | Smith et al. ............... | 165/908 |
| 5,021,924 | 6/1991 | Kieda et al. ............... | 165/908 |
| 5,196,989 | 3/1993 | Zsolnay ..................... | 165/80.3 |
| 5,202,816 | 4/1993 | DeWilde .................... | 165/80.3 |
| 5,349,831 | 9/1994 | Daikoku et al. ............. | 165/908 |
| 5,415,226 | 5/1995 | Koo ......................... | 165/135 |
| 5,428,503 | 6/1995 | Matsushima et al. .......... | 165/908 |
| 5,436,501 | 7/1995 | Ikeda ....................... | 165/80.4 |
| 5,592,363 | 1/1997 | Atarashi et al. ............ | 165/80.4 |

FOREIGN PATENT DOCUMENTS

| | | |
|---|---|---|
| 1-175298 | 7/1989 | Japan . |
| 1112095 | 8/1989 | Japan . |
| 2-42494 | 6/1990 | Japan . |
| 3-1542 | 5/1991 | Japan . |
| 4-99893 | 1/1992 | Japan . |
| 4-347494 | 12/1992 | Japan ............................... 165/908 |

*Primary Examiner*—Ira S. Lazarus
*Assistant Examiner*—Terrell McKinnon
*Attorney, Agent, or Firm*—Ostrolenk, Faber, Gerb & Soffen, LLP

[57] ABSTRACT

A cooling apparatus having a simple structure is provided in which the temperature distribution of an object being cooled can be kept even and no whistle sound is generated at a duct. The apparatus comprises a duct including a nozzle plate through which a nozzle is bored so that a coolant is jetted through the nozzle, colliding as a cooling stream against an object. An inclined opposite plate is disposed opposite the nozzle plate so as to make the current of the coolant tend to the nozzle plate. A resonance-preventing plate is attached to an area of the inside surface of the opposite plate including the point at which a horizontal extension of the nozzle intersects the inside surface of the opposite plate so that the horizontal distance l of the nozzle from the inside surface of the resonance-preventing plate is not equal to a resonance distance $l_0$. Because the horizontal distance l of any nozzle from the opposite plate or the resonance-preventing plate, does not coincide with the resonance distance $l_0$ of the cooling stream, a standing wave W is not generated in the duct, preventing the generation of a whistle sound.

8 Claims, 9 Drawing Sheets

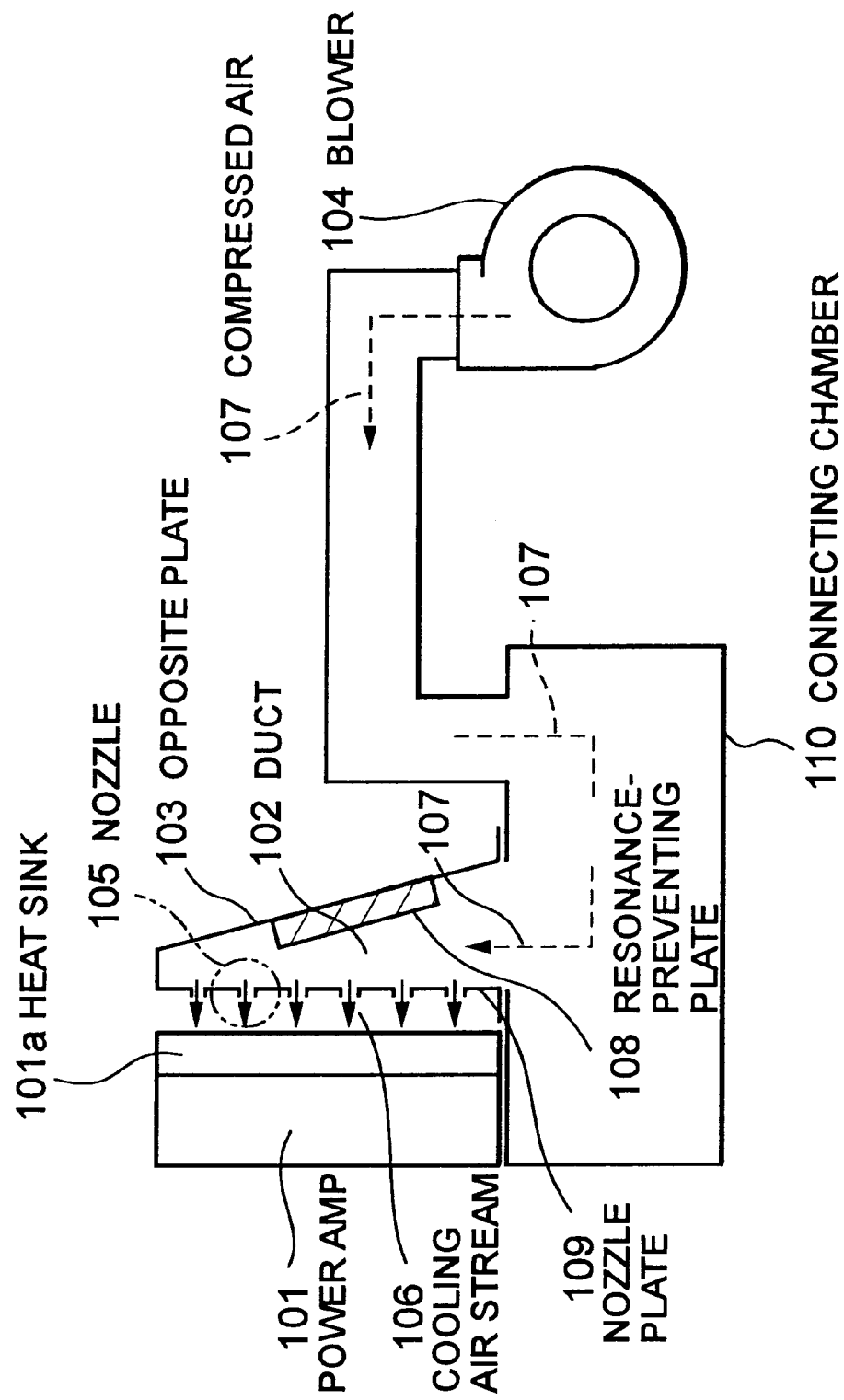

105 NOZZLE

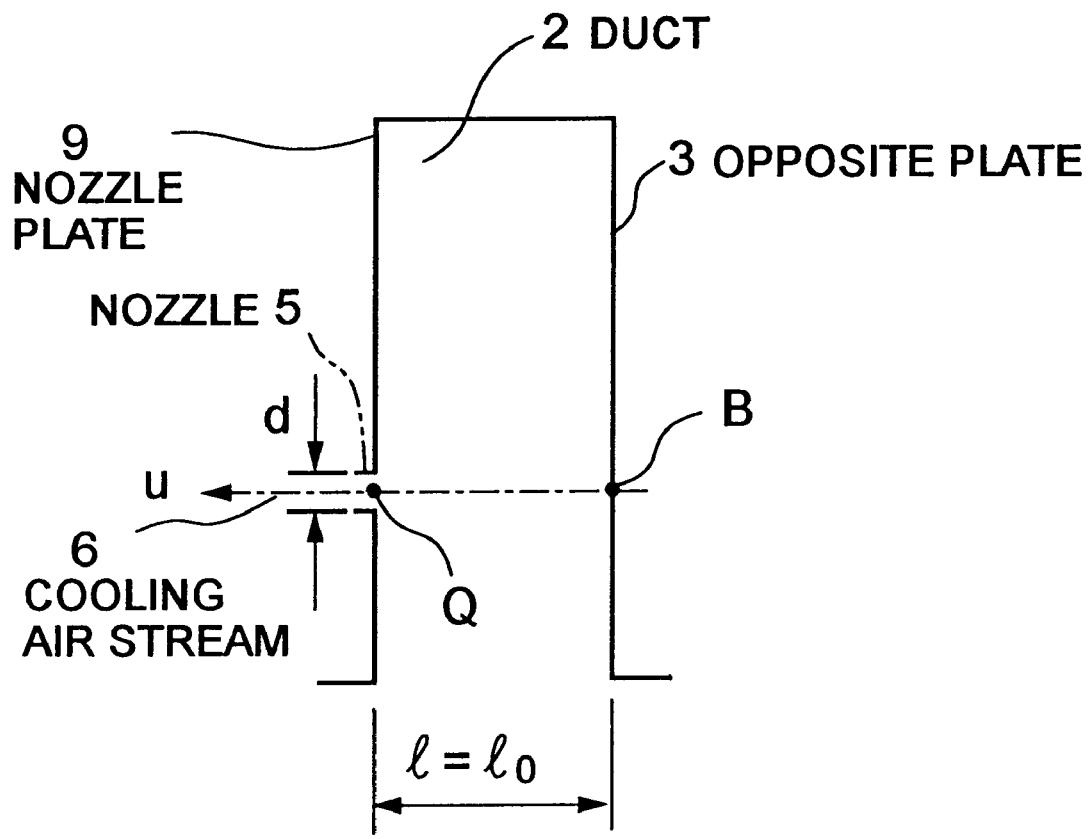

COOLING APPARATUS

BACKGROUND OF THE INVENTION

1. Field of the Invention

The present invention relates to a cooling apparatus in which streams of a coolant are made to blow against an object to cool as jet streams.

2. Description of Related Art

A cooling apparatus is generally used for cooling various electronic devices with generation of heat. In particular, for cooling an electronic device with a great generation of heat such as a power amplifier of a television transmitter, used is a cooling apparatus in which a coolant such as air is jetted through nozzles and made to blow directly against an object to cool so that the object is cooled by compulsory heat exchange.

As an example of a related art cooling apparatus, Japanese Patent Unexamined Publication No. Hei 1-175298 (published in Japan on Jul. 11, 1989) discloses a cooling structure for an electronic circuit. The structure includes an air pipe provided with a plurality of nozzles for spouting air, which flows in the pipe, toward an element with a little generation of heat such as a memory IC.

The structure disclosed in this publication includes a fixing board which is attached to a frame so as to be opposite to a circuit board, a cooling board which is in contact with an element with a great generation of heat through an elastic sheet with a good heat conductivity attached to the fixing board, and is provided in its inside with a flow passage for allowing a liquid coolant to flow, and the air pipe which is attached to the fixing board and provided with the nozzles for spouting air, which flows in the pipe, toward the element with a little generation of heat. The element with a little generation of heat is cooled by a so-called collision cooling method.

Another related art cooling apparatus will be described further.

FIG. 5 is a cross-sectional side view of a related art cooling apparatus.

In the cooling apparatus shown in FIG. 5, air sucked through a blower 4 is introduced into a connecting chamber 10 as compressed air 7. After introduced into a duct 2, the compressed air 7 is horizontally jetted as cooling air streams 6 through nozzles 5 each bored through a nozzle plate 9 of the duct 2, and the air is made to blow against a heat sink 1a of a power amplifier 1 as the object to cool so that the object is cooled by compulsory heat exchange.

When such a related art cooling apparatus as described above is applied to an electronic device with a great generation of heat, however, the following problems arise.

As the first problem, a high-power television transmitter is received in a receiving rack, the heat sink 1a of the power amplifier 1 of the television transmitter is opposite to a plurality of nozzles 5, and the duct 2 has the same horizontal cross section throughout its vertical length. As a result, the quantities of the cooling air streams 6 jetted through the nozzles 5 are uneven in the manner that the lower the nozzle 5 is, the more the quantity is. This causes an inclination in the temperature distribution of the heat sink 1a, and the lower portion of the heat sink 1a is fully cooled but the upper portion of it is hardly cooled.

As the second problem, a noise called jet noise is generated at the nozzles 5 when the cooling air streams 6 are jetted through the nozzles 5. Because this jet noise is a random noise consisting of frequencies in a broad range, it is a mere noise which is heard as a rumble, and does not give so unpleasant feeling to a human in the neighborhood. But in case that the horizontal distance in the duct 2 along the direction in which the cooling air streams 6 are jetted, that is, the horizontal distance l between the nozzle plate 9 and the opposite plate 3 coincides with a resonance distance $l_0$ which is equal to the wavelength of a specific peak frequency in the jet noise, a resonance occurs to increase the energy of the noise. A big sound like a whistle is therefore generated and it gives an unpleasant feeling to a human in the neighborhood.

FIG. 6A is an enlarged partial side view in section for illustrating the principle of occurrence of the resonance in the cooling apparatus of FIG. 5. FIG. 6B is an enlarged view of a nozzle 5 of FIG. 6A. FIG. 7 is an enlarged partial side view in section for illustrating the principle of occurrence of the resonance in the cooling apparatus of FIG. 5.

In case that the horizontal distance l between a nozzle 5 (for example, a point P in FIG. 6A) of the nozzle plate 9 and a point (for example, a point A in FIG. 6A) at which a horizontal extension of the nozzle 5 intersects the inside surface of the opposite plate 3 is equal to a resonance distance $l_0$ at which a standing wave W of a cooling air stream 6 is generated in the duct 2, that is, (the horizontal distance l)=(a resonance distance $l_0$), a resonance occurs in the duct 2 due to the standing wave W of the cooling air stream 6 and so a whistle sound is generated.

SUMMARY OF THE INVENTION

It is an object of the present invention to provide a cooling apparatus with a simple structure in which the temperature distribution of an object to cool can be kept even and no whistle sound is generated at a duct.

The first feature of the present invention is that a cooling apparatus comprises a duct including a nozzle plate through which a nozzle is bored so that a coolant is jetted through the nozzle and made to collide against an object to cool, and an inclined opposite plate which is disposed oppositely to the nozzle plate so as to make the coolant tend to the nozzle plate, and a resonance-preventing plate attached to an area of the inside surface of the opposite plate including the point at which an horizontal extension of the nozzle intersects the inside surface of the opposite plate so that the horizontal distance l [m] of the nozzle from the inside surface of the resonance-preventing plate is not equal to a resonance distance $l_0=(1/2)\cdot\{(c\cdot d)/(v\cdot u)\}$ where c represents the speed of sound [m/s] in a stream of the coolant, d represents the diameter [m] of the nozzle, $v$ represents Strouhal number, and u represents the velocity [m/s] of the stream of the coolant jetted through the nozzle.

The second feature of the present invention is that the cooling apparatus according to the first feature further comprises a connecting chamber communicating with the duct to introduce the coolant into the duct.

The third feature of the present invention is that the cooling apparatus according to the first feature further comprises a connecting chamber communicating with the duct at one end of the connecting chamber to introduce the coolant into the duct, and a blower communicating with the connecting chamber at another end of the connecting chamber for feeding air into the duct as the coolant.

The fourth feature of the present invention is that the cooling apparatus according to the first feature further comprises a connecting chamber communicating with ducts including the above duct to introduce the coolant into each of the ducts, and objects to cool including the above object to cool which are disposed oppositely to the ducts, respectively.

The fifth feature of the present invention is that air is used as the coolant of the first feature.

The sixth feature of the present invention is that compressed air is used as the coolant of the first feature.

The seventh feature of the present invention is that the object to cool of the first feature is an electronic circuit.

The eighth feature of the present invention is that the object to cool of the first feature is a power amplifier.

BRIEF DESCRIPTION OF THE DRAWINGS

FIG. 1 is a cross-sectional side view of a cooling apparatus according to the first embodiment of the present invention.

FIG. 7 is an enlarged partial side view in section for illustrating the principle of occurrence of the resonance in the cooling apparatus of FIG. 5.

DETAILED DESCRIPTION OF THE PREFERRED EMBODIMENTS

Figure 2A:
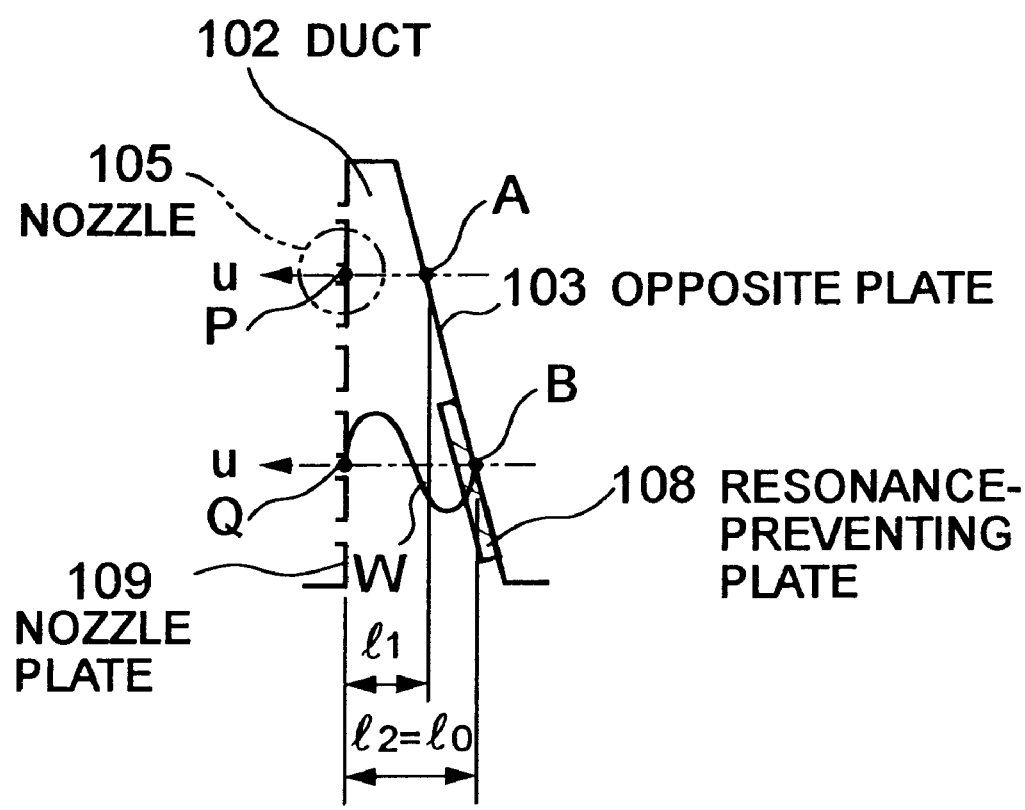
FIG. 2A is an enlarged partial side view in section for illustrating the principle of occurrence of the resonance in the cooling apparatus according to the FIG. 1 embodiment.
Figure 2B:
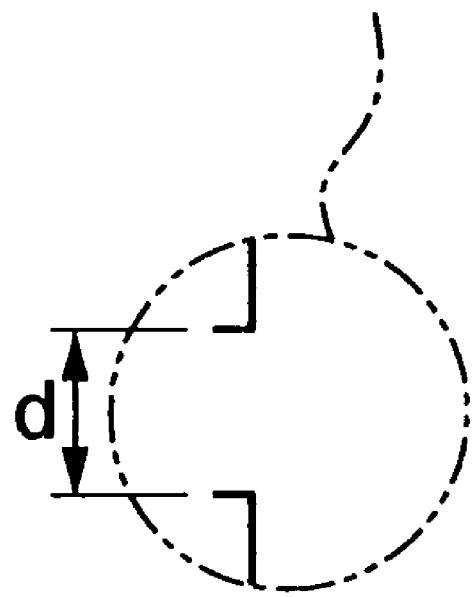
FIG. 2B is an enlarged view of a nozzle of FIG. 2A.

FIG. 1 is a cross-sectional side view of a cooling apparatus according to the first embodiment of the present invention.

In FIG. 1, compressed air 107 which is a kind of coolant fluid passes through a duct 102.

The duct 102 has a nozzle plate 109 through which nozzles 105 are bored, and an inclined opposite plate 103 disposed oppositely to the nozzle plate 109.

The nozzle plate 109 forms a part of the duct 102 which communicates with a connecting chamber 110, and is provided with the nozzles 105 through which compressed air 107 is horizontally jetted as high-speed cooling air streams 106.

The opposite plate 103 is disposed oppositely to the nozzle plate 109, forms a part of the duct 102 which communicates with the connecting chamber 110, and makes the current of compressed air 107, which is fed from the connecting chamber 110, tend to the nozzle plate 109.

The cooling air streams 106 jetted are made to blow perpendicularly to an object to cool such as a heat sink 101a of a power amplifier 101 to compel the object to heat exchange. The exchanged heat capacity per unit time is thereby increased and so the object is cooled with a high cooling efficiency.

The connecting chamber 110 communicates with the duct 102 for feeding compressed air 107.

A blower 104 is for feeding compressed air 107 into the connecting chamber 110.

For keeping all of the quantities of the cooling air streams 106 through the nozzles 105 even and cooling the heat sink 101a uniformly throughout it, the duct 102 is formed such that the opposite plate 103 inclines relatively to the nozzle plate 109 as shown in FIG. 1.

In this manner, the cooling air streams 106 jetted through a plurality of nozzles 105 are made to blow perpendicularly to the heat sink 101a to compel the heat sink 101a to heat exchange with the cooling air streams 106. The heat sink 101a is therefore cooled such that the temperature distribution becomes even throughout the heat sink 101a.

Because the opposite plate 103 inclines relatively to the nozzle plate 109, there may be a nozzle 105 whose horizontal distance l from the inside surface of the opposite plate 103 coincides with a resonance distance $l_0$ of a specific frequency in the cooling air stream 106 jetted through the nozzle 105, as shown in FIG. 1. In that case, there is a fear that a resonance occurs to generate a whistle sound like the related art cooling apparatus.

In case that the horizontal distance l between a nozzle 105 and the inside surface of the opposite plate 103 coincides with a resonance distance $l_0$, therefore, a resonance-preventing plate 108 with a certain thickness is attached to a certain area of the inside surface of the opposite plate 103 including a point (a point B in FIG. 2A) on a horizontal extension of the nozzle 105 as shown in FIG. 1. The horizontal distance l of any nozzle 105 from the inside surface of the opposite plate 103 thereby does not coincide with any resonance distance $l_0$. Any resonance is thus prevented fundamentally and so no whistle sound is generated.

As material of the resonance-preventing plate 108, metal such as iron and aluminum is suitable because its surface is hard to exfoliate even when highly frequent oscillations due to collision of the high-speed cooling air streams 106 against the surface of the resonance-preventing plate 108 are applied to the surface for a long time. But other various kinds of material such as resin and a porous ceramic material may be used.

Because the inclined opposite plate 103 is disposed oppositely to a plurality of nozzles 105 as shown in FIG. 2A, there are horizontal distances l according to combinations of the nozzles 105 and the opposite plate 103. As a result, there may be a nozzle 105 whose horizontal distance l from the opposite plate 103 coincides with a resonance distance $l_0$ of a peak frequency $f_0$ in the jet noise.

For example, because the horizontal distance $l_1$ between a point A on the inside surface of the opposite plate 103 and a nozzle 105 (a point P) is in a relation of $l_1 < l_0$, a standing wave W is not generated between those points A and P, and so no whistle sound is generated.

In contrast with this, because the horizontal distance $l_2$ between a point B on the inside surface of the opposite plate 103 and a nozzle 105 (a point Q) is in a relation of $l_2 = l_0$, a standing wave W of a specific frequency (a resonance frequency f) contained in the corresponding cooling air stream 106 is generated between those points B and Q, and so a whistle sound is generated due to a resonance.

Figure 3:
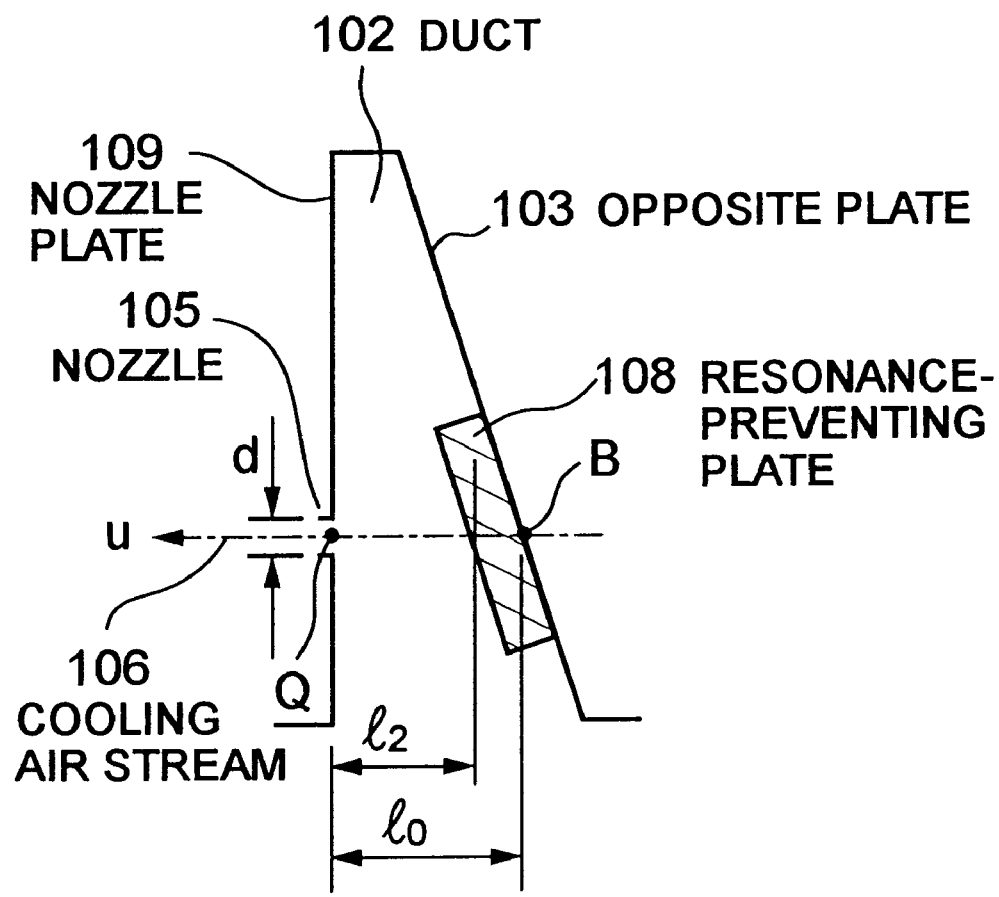
FIG. 3 is an enlarged partial side view in section for illustrating the principle of occurrence of the resonance in the cooling apparatus according to the FIG. 1 embodiment.

For preventing the generation of the standing wave W between the points B and Q, the resonance-preventing plate 108 having a thickness of about several millimeters for example is attached to a certain area of the inside surface of the opposite plate 103 of the duct 102 including the point B as shown in FIG. 3 so that the horizontal distance l between the nozzle 105 and the resonance-preventing plate 108 does not coincide with the resonance distance $l_0$. The position of attaching the resonance-preventing plate 108 and the thickness of the resonance-preventing plate 108 are suitably selected so that horizontal distances l do not coincide with resonance distances $l_0$ throughout the interior of the duct 102. In this manner, the generation of such a standing wave W in the duct 102 is prevented fundamentally and so no whistle sound is generated.

A peak frequency $f_0$ [Hz] is expressed as follows where $\upsilon$ represents Strouhal number, u represents the velocity [m/s] of a cooling air stream 106, and d represents the diameter [m] of each nozzle 105.

$$f_0 = \upsilon \cdot (u/d) \tag{1}$$

A resonance distance $l_0$ [m] is expressed as follows where c represents the speed of sound [m/s] and f represents a resonance frequency [Hz].

$$l_0 = (\tfrac{1}{2}) \cdot (c/f) \tag{2}$$

When a resonance occurs, that is, (the peak frequency $f_0$)=(the resonance frequency f), the resonance distance $l_0$ is obtained as follows from the expressions (1) and (2).

$$l_0 = (\tfrac{1}{2}) \cdot \{(c \cdot d)/(\upsilon \cdot u)\} \tag{3}$$

That is, the resonance-preventing plate 108 is attached to a certain area of the inside surface of the opposite plate 103 so that the horizontal distance l of any nozzle 105 from this point at which a horizontal extension of the nozzle 105 intersects the inside surface of the opposite plate 103 or the resonance-preventing plate 1 does not coincide with a resonance distance $l_0$. The generation of a standing wave W in the duct 102 is thereby prevented and so the generation of a whistle sound is prevented.

Figure 4:
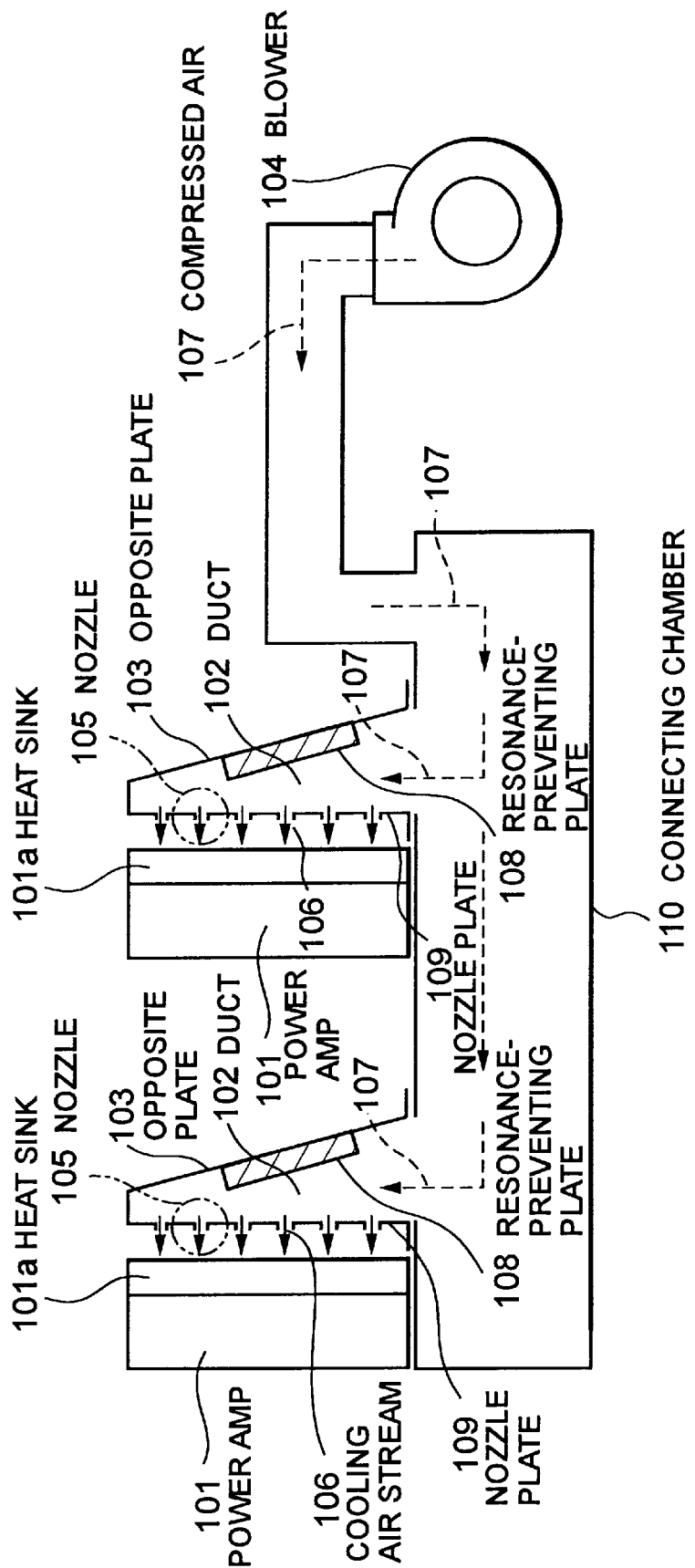
FIG. 4 is a cross-sectional side view of a cooling apparatus according to the second embodiment of the present invention.
Figure 5:
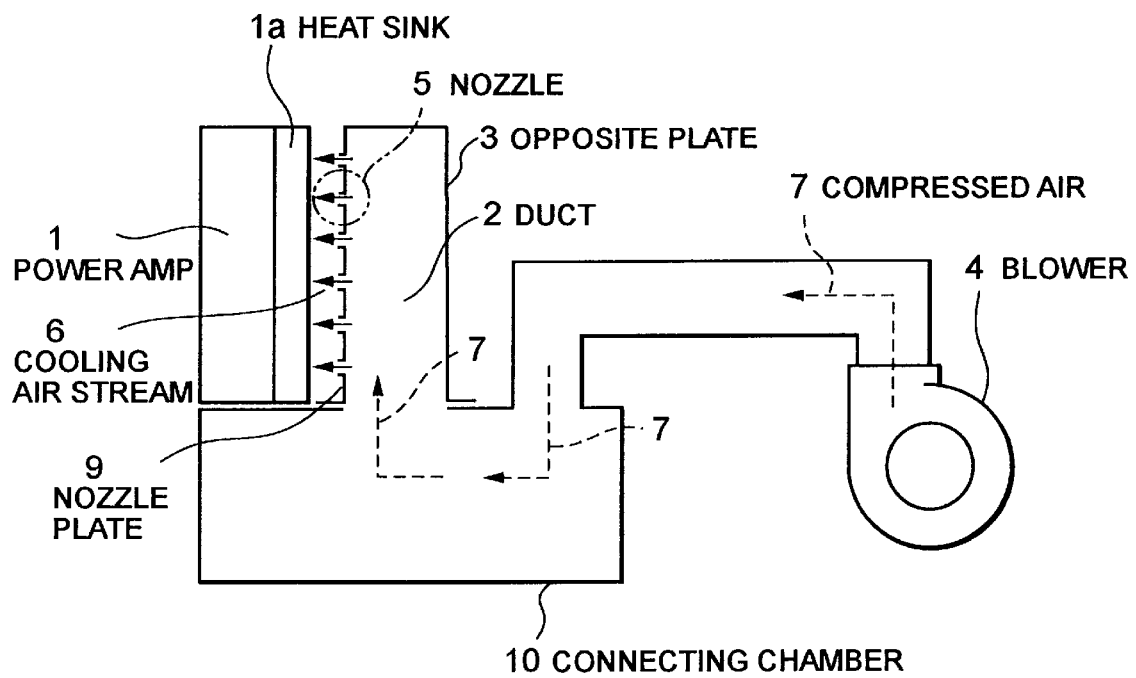
FIG. 5 is a cross-sectional side view of a related art cooling apparatus.
Figure 6A:
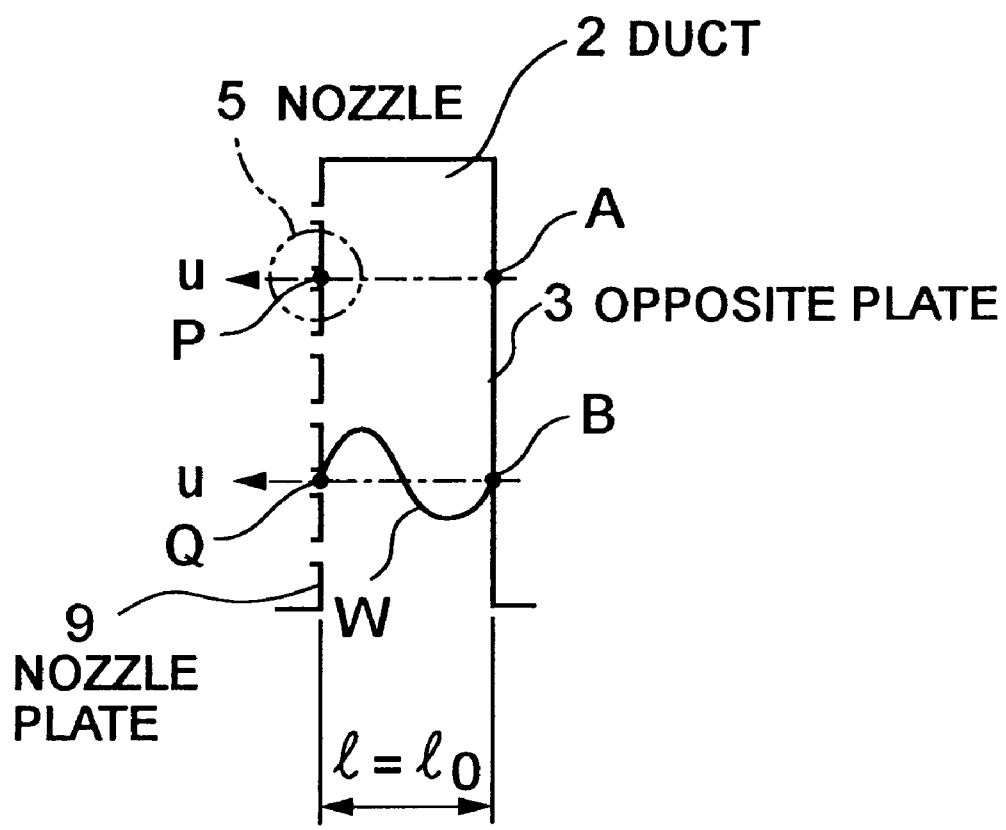
FIG. 6A is an enlarged partial side view in section for illustrating the principle of occurrence of the resonance in the cooling apparatus of FIG. 5.
Figure 6B:
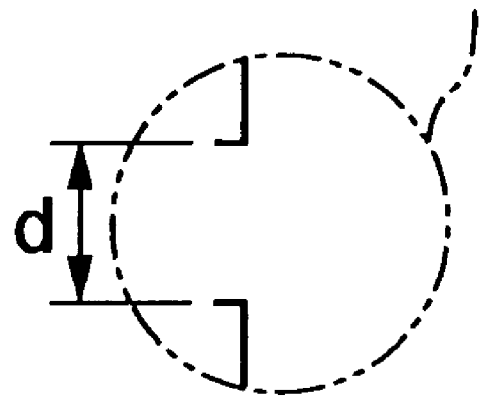
FIG. 6B is an enlarged view of a nozzle of FIG. 6A.

FIG. 4 is a cross-sectional side view of a cooling apparatus according to the second embodiment of the present invention.

The cooling apparatus shown in FIG. 4 is for cooling a plurality of power amplifiers 101. This cooling apparatus comprises a connecting chamber 110 which is extended to the left in FIG. 4. The power amplifiers 101 to be cooled are disposed in parallel on the connecting chamber 110. Ducts 102 each communicating with the connecting chamber 110 are disposed oppositely to the power amplifiers 101, respectively. The other structure of this apparatus is the same as that of FIG. 1.

As described above, according to the present invention, an object can be uniformly cooled by a simple structure because an inclined surface is disposed oppositely to a nozzle plate of a duct so as to make cooling streams of even quantities of a coolant throughout the vertical length of the duct.

Besides, a whistle sound can be surely prevented because a resonance-preventing plate is provided in a duct so that no standing wave is generated even in case of the duct the transverse section of which changes in shape along a longitudinal axis of the duct.

Besides, even a plurality of objects can be cooled with ease in the manner that ducts communicating with one another through a connecting chamber are disposed oppositely to the objects, respectively.

What is claimed is:

1. A cooling apparatus comprising a duct including a nozzle plate through which a nozzle is bored so that a coolant is jetted through said nozzle and made to collide against an object to cool, and an inclined opposite plate which is disposed oppositely to said nozzle plate so as to make said coolant tend to said nozzle plate, and a resonance-preventing plate attached to an area of the inside surface of said opposite plate including the point at which an horizontal extension of said nozzle intersects the inside surface of said opposite plate so that the horizontal distance l m of said nozzle from the inside surface of said resonance-preventing plate is not equal to a resonance distance $l_0 = (\tfrac{1}{2}) \cdot \{(c \cdot d)/(\upsilon \cdot u)\}$ where c represents the speed of sound m/s in a stream of said coolant, d represents the diameter m of said nozzle, $\upsilon$ represents Strouhal number, and u represents the velocity m/s of said stream of said coolant jetted through said nozzle.

2. A cooling apparatus according to claim 1, further comprising a connecting chamber communicating with said duct to introduce said coolant into said duct.

3. A cooling apparatus according to claim 1, further comprising a connecting chamber communicating with said duct at one end of said connecting chamber to introduce said coolant into said duct, and a blower communicating with said connecting chamber at another end of said connecting chamber for feeding air into said duct as said coolant.

4. A cooling apparatus according to claim 1, further comprising a connecting chamber communicating with ducts including said duct to introduce said coolant into each of said ducts, and objects to cool including said object to cool which are disposed oppositely to said ducts, respectively.

5. A cooling apparatus according to claim 1, wherein air is used as said coolant.

6. A cooling apparatus according to claim 1, wherein compressed air is used as said coolant.

7. A cooling apparatus according to claim 1, wherein said object to cool is an electronic circuit.

8. A cooling apparatus according to claim 1, wherein said object to cool is a power amplifier.

* * * * *